United States Patent [19]
Cohen et al.

[11] Patent Number: 5,781,682
[45] Date of Patent: Jul. 14, 1998

[54] LOW-COST PACKAGING FOR PARALLEL OPTICAL COMPUTER LINK

[75] Inventors: Mitchell Simmons Cohen, Millwood, N.Y.; Marco Gauvin, Granby, Canada; Glen Walden Johnson, Yorktown Heights; Daniel M. Kuchta, Cortlandt Manor, both of N.Y.; Andre Lacerte, Granby, Canada; Nicholas Anthony Lee, Woodbury, Minn.; Sylvain Ouimet, St. Hubert, Canada; Stephen Louis Spanoudis, Lexington, Ky.; Stephane Tremblay, Deauville, Canada; Jeannine Madelyn Trewhella, Peekskill, N.Y.

[73] Assignees: International Business Machines Corporation, Armonk, N.Y.; Lexmark International, Inc., Lexington, Ky.; Minnesota Mining and Manufacturing Company, St. Paul, Minn.

[21] Appl. No.: 595,149

[22] Filed: Feb. 1, 1996

[51] Int. Cl.⁶ .................. G02B 6/00; G02B 6/36
[52] U.S. Cl. ............................................ 385/89
[58] Field of Search ...................... 385/88–89, 147

[56] References Cited

U.S. PATENT DOCUMENTS

| | | |
|---|---|---|
| 4,637,685 | 1/1987 | Gordon ................................ 385/89 |
| 4,725,692 | 2/1988 | Ishii et al. ........................ 174/52 FP |
| 4,787,969 | 11/1988 | Norris et al. ........................ 385/89 |
| 4,875,138 | 10/1989 | Cusack ............................... 174/52.4 |
| 4,951,120 | 8/1990 | Hagiwara et al. .................... 357/70 |
| 5,163,108 | 11/1992 | Armiento et al. .............. 385/49 X |
| 5,221,984 | 6/1993 | Furuyama et al. ............. 385/89 X |
| 5,223,738 | 6/1993 | Okada ................................... 257/666 |
| 5,241,614 | 8/1993 | Ecker et al. ..................... 385/89 X |
| 5,338,972 | 8/1994 | Negoro ............................... 257/666 |
| 5,369,059 | 11/1994 | Eberlein ............................. 437/213 |
| 5,388,029 | 2/1995 | Moriyama .......................... 361/760 |
| 5,410,182 | 4/1995 | Kurafuchi et al. ................ 257/692 |
| 5,457,370 | 10/1995 | Templeton, Jr. et al. ........ 257/666 |

*Primary Examiner*—Akm E. Ullah
*Attorney, Agent, or Firm*—Whitham, Curtis & Whitham; Robert P. Tassinari, Jr.

[57] ABSTRACT

Parallel optical coupling apparatus for coupling a connector attached to one end of a parallel optical cable to a receiver or transmitter array. A parallel fiber optic assembly includes a receiver or transmitter array subassembly that houses a parallel optical coupler for transferring optical signals from an array of sources (e.g., lasers) in the assembly to the connector, or from the connector to an array of receiving elements in the assembly. A connector shell is provided that properly aligns the connector with respect to the optical coupler array.

15 Claims, 10 Drawing Sheets

LOW-COST PACKAGING FOR PARALLEL OPTICAL COMPUTER LINK

The invention was made with government support under Cooperative Agreement No. 70NANB4H1521, awarded by the U.S. Department of Commerce, National Institute of Standards and Technology. The U.S. Government has certain rights in the invention.

FIELD OF THE INVENTION

The invention is in the field of assemblies that provide means by which multiple electronic signals are converted to multiple light signals (or multiple light signals are converted into multiple electronic signals) for the purpose of transferring digital information from (or to) an electronic device (typically an interface card) to (or from) a fiber optic cable having multiple fibers.

BACKGROUND AND SUMMARY OF THE INVENTION

In the field of data communications, the rate at which information is passed between computers, or between a computer and a high speed peripheral device, has been steadily rising. Traditionally, this function has been accomplished by cables made from copper wires. These cables may include multiple wires, each wire being a single conductor, bundled or in a ribbon configuration, coaxial cables, twisted pairs of wires, etc., and shielded in various ways.

Several factors appear to be driving the data communications industry to solutions that do not require cables constructed from copper wires. First, the size of cables and connectors with large numbers of parallel conductors is becoming unacceptably large. Second, the radio frequency power radiated by cables in which high speed signals are transmitted is difficult to control and the susceptibility of the wires to picking up radio frequency signals from external radio frequency noise sources is difficult to minimize. Third, the length of low-cost cable over which high-speed signals may be sent in a reasonably-priced copper cable technology is too short for applications currently contemplated.

For these reasons, low-cost, high-speed, compact, low-EMI, parallel fiber optic data interconnects have been a goal within the optoelectronics industry.

Because there has yet been no agreement within the industry regarding the various engineering and cost compromises that must be made when designing such data interconnects, no significant standard has arisen. For example, unlike this invention, most products, prototypes or proposals for high-speed parallel fiber optic interconnects use standard 62.5/125 micrometer multimode optical fiber.

Among the features of a high-speed, parallel, fiber optic, data communications link that are foreseen as needed by the computer industry in the near future are:

1) speeds from 200 megabits per second (Mbs) to 1000 Mbs per channel, with aggregate speeds from 150 megabytes per second (MBs) to 2 gigabyte per second (GBs), 2) cable lengths from approximately ten meters to several hundreds of meters, 3) cables offering low weight, high flexibility, and relatively high density as measured by the average cross-sectional area per channel, 4) connectors of sufficiently small size that their impact on the design of connector panels and on the use of edge real estate on interface cards is reasonable, 5) low radiated electromagnetic power, low susceptibility to electromagnetic interference, and avoidance of ground loops, 6) hot pluggability (the possibility for reconfiguring a computer while running), and 7) low cost to produce.

Such features are difficult to attain with conventional copper cable, except for very short interconnects. Serializing parallel line data interfaces onto high speed single fiber optic lines has been shown to be practical for distances of greater than about 20 meters but only for data rates $\leq 100$ megabytes/sec. Also, the functions of serialization and deserialization, and associated clocking of the data often add too much time delay to the transmission.

Since the cable, connectors, transmitters, receivers, and packaging associated with optoelectronic links have historically been relatively expensive, it has proven difficult to achieve optoelectronic links of low enough cost to compete with copper cable.

Previously described parallel line optical interconnects have adapted the optoelectronic chips and the optical packaging from high speed serial data link technology, resulting in excessively expensive parallel optical interconnects. One specific drawback of the prior systems is the use of components which require precision alignment ($\leq 5$ µm tolerance in alignment) between optoelectronic chips and optical elements, and thus a package assembly procedure requiring fine manipulations of small parts and even electrical activation of the device to aid in its alignment.

A promising approach to this problem has been previously suggested and involves the abandonment of the serialization-deserialization, single-fiber scheme used in previous computer optoelectronic data links in favor of a parallel link. Here an array of light sources is connected by a multi-fiber "ribbon" cable to an array of detectors, so that the difficulties associated with ultra high speed sources, detectors, circuits, and packaging are avoided, and the necessity for serialization/deserialization circuits is bypassed. However, this method requires the availability of relatively inexpensive (produced with high yields) detector and light-source array chips, low-cost means of aligning these chips to the fiber cable, and low-cost array connectors and cabling. In addition, special efforts must be made to keep the packaging costs of the transmitter and receiver subassemblies as low as possible.

A parallel optical interconnect ("POI") (which includes an array of optical links, each comprising a transmitter, a fiber and a receiver) in accordance with the present invention and described below achieves the desired performance goals at costs which are considerably lower than those associated with alternative POI. This result is achieved by a unique combination of components chosen for their ability to be packaged with loose alignment tolerances as well as their inherent low cost, together with module and cable components chosen for their ability to take advantage of the looser alignment tolerances to dramatically lower assembly cost, as well as their inherent low intrinsic cost. The salient features of this unique POI are:

1. Inexpensive molded thermoplastic parts are used for optical packaging elements. This approach has been previously employed with a single-channel optoelectronic link by making the housing, ferrule, bore, and lens of the optical subassembly by injection molding. In the present work the approach is extended to a parallel optical link.

2. It has recently been demonstrated that high yield and high uniformity vertical cavity surface emitting laser ("VCSEL") monolithic array chips and MSM-PD photoreceiver array chips are manufacturable. These OE chips are employed in the present invention, not only because of their low inherent cost, but because the VCSEL's optical beam emission is relatively collimated (compared to edge-emitting laser or LED alternatives) making it easier to align the VCSEL array chip with the optics of the transmitter module, and because the MSM-PD has a large light sensitivity area (compared to high speed pin PDs) making the photoreceiver array chip easier to align to the optics in the receiver module.

3. Plastic-package leadframe technology, adapted from the high volume IC industry, is used for this POI because optical alignment features of sufficient precision can be co-molded with the module housing, and because it is one of the lowest cost high lead count multichip carriers available.

4. A unique plastic-molded optical coupler array is used for coupling light from the optical transmitter chip to the fibers and light from the fibers to the receiver chip. A 90 degree bend in the optical path can be incorporated in the optical coupler in order to maintain the plane of the cable parallel to the plane of the circuit card and chip sets.

5. Large-core, plastic-clad fiber (200/230 micrometers diameter, wherein the first term refers to the core and the second refers to the cladding about the core; it should be understood, however, that the invention is applicable with other core/cladding combinations as well) is used to make a fiber ribbon cable. The core diameter of each fiber is large enough to permit simplified, passive alignment, yet not so large that the fiber ribbon cable has inadequate flexibility. In order to maintain low cost, optical ribbon jumper cables are made by fabricating the connector body directly on the parallel fibers of the fiber ribbon cable. Lowest cost is achieved through the use of step-index fiber, which is appropriate for short-distance applications, e.g., up to about 50 meters. For those applications requiring longer distances, large-core graded index fiber may be used.

6. Alignment of the fiber to the optically active chips is usually a difficult and expensive task in optoelectronic packaging. In order to achieve low-cost packaging, alignment in the present application (in the preferred embodiment) is carried out with the aid of special but easily fabricated locating features provided in the package, which permit positioning of the optically active chips and the optical coupler array by simple mechanical reference to these locating features. This method avoids more expensive "active" alignment (i.e., searching for the optimum position with the chips activated) or "passive" alignment based on high precision micro-features which are difficult to fabricate.

7. A protective shell is used to control the connector approach to the optical coupler. The shell provides angled lead-in and alignment keys to ensure that the connector enters the coupler at or near the correct position and at or near the correct angle. The shell, in conjunction with latch features on the cable connector, gives a slight pre-load force on the optical fibers to the optical coupler, and provides a strain-relief release in case excess pull-out force is exerted on the cable, thus protecting the cable, module and circuit card.

In accordance with the invention, a 2 byte wide POI operating at 500 Mb/s per line utilizing 20 parallel lines with a digital logic interface was designed and built based on the features listed above. A channel pitch of 500 micrometers was adopted. A duplex parallel optical link was designed, comprising a transmitter module and a receiver module at each end of two optical ribbon jumper cables, i.e., the link included two transmitter modules and two receiver modules. The link was designed for either synchronous or asynchronous operation. Links having different speeds, number of channels, pitch, fibers (e.g., standard 50/125 or 62.5/125 micrometer multimode communications fiber instead of 200/230 micrometer fiber), optical connectors, operating wavelength, and I/O interfaces could easily be designed using the same basic principles described here. Also, instead of a separate transmitter module and receiver module at each end of the cable, a transceiver package which included both transmitter and receiver components could easily be designed.

DETAILED DESCRIPTION OF THE INVENTION

Figure 1:
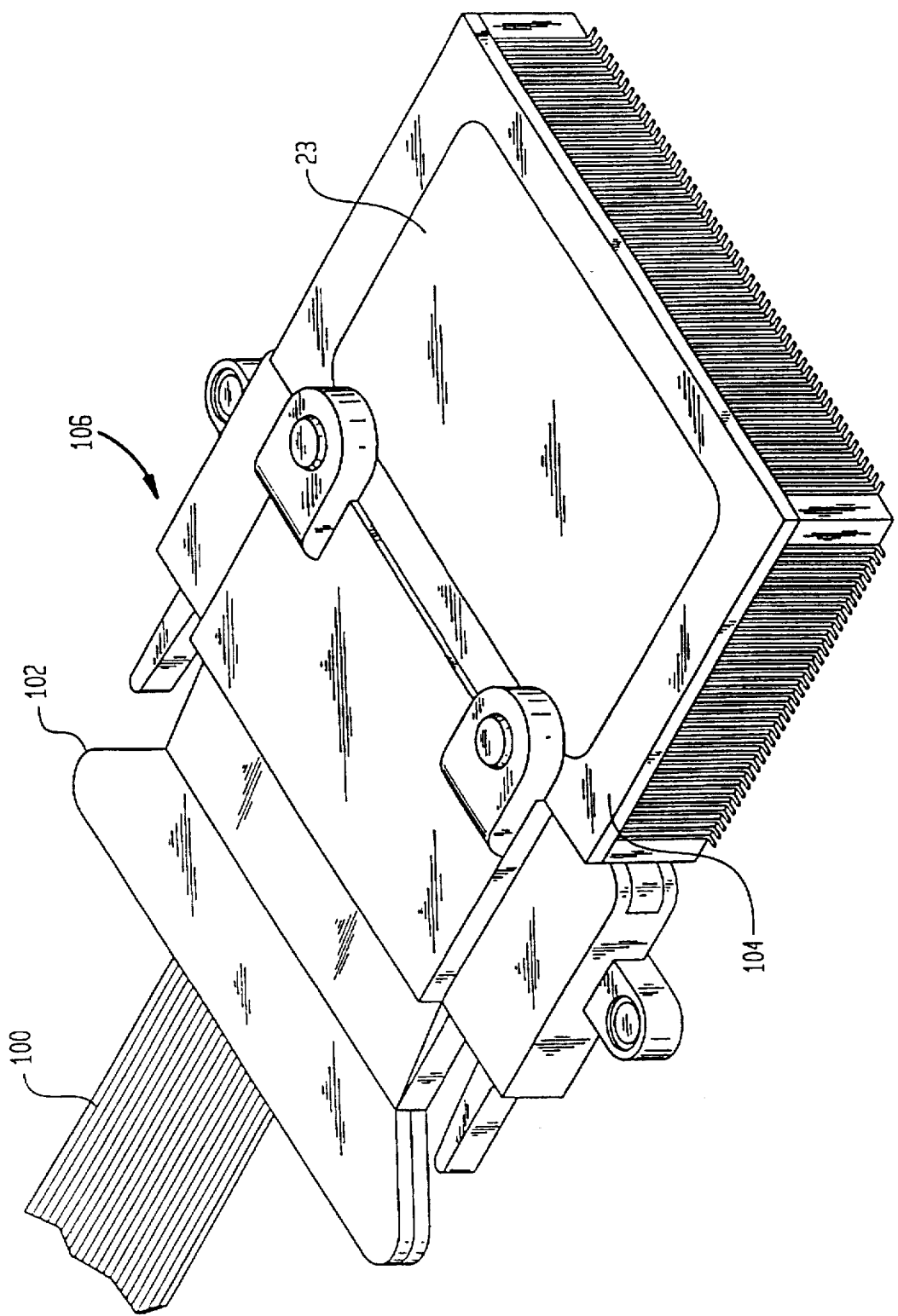
FIG. 1 is a perspective depiction of various components of one end of a parallel optical link including a fiber ribbon cable having a parallel fiber optic connector attached thereover, a connector shell and a parallel fiber optic subassembly.

Definitions used herein
  1. heat slug:
      A metal part, molded into the premolded package, that serves as a mechanical support for the semiconductor chips and serves to conduct heat from the semiconductor chips.

2a. premolded package:

A thermoset filled-epoxy package having a molded-in heat slug, insulating tape and leadframe.

2b. transmitter premolded package:

The premolded package into which has been molded the transmitter leadframe, insulating tape and heat slug and designed to accept after molding, among other items, the laser array chip and the driver chip.

2c. receiver premolded package:

The premolded package into which has been molded the receiver leadframe, insulating tape, and heat slug, and designed to accept after molding, among other items, the receiver chip.

3. driver array chip:

The semiconductor device that receives incoming electronic logic-level signals, that generates drive current for the laser array chip and that is attached to the heat slug in the transmitter premolded package.

4. receiver array chip:

The semiconductor device having an array of photodetector sites that generates electronic signals responsive to receiving light and that is attached to the heat slug in the receiver premolded package.

5. laser array chip:

A semiconductor device made in a configuration that provides an array of surface emitting lasers. A preferred embodiment uses vertical cavity surface emitting lasers (VCSELs).

6a. leadframe:

A metal part designed to provide a plurality of electrical conductors which provide electrical paths from the circuit board on which the parallel fiber optic assembly module is placed to the internal portions of the premolded package.

6b. transmitter leadframe:

The leadframe designed to provide a plurality of electrical conductors for building a transmitter premolded package 6c. receiver leadframe:

The leadframe designed to provide a plurality of electrical conductors for building a receiver premolded package 7a. parallel fiber optic assembly:

A term used to refer either to a transmitter parallel fiber optic assembly or to a receiver parallel fiber optic assembly.

7b. transmitter parallel fiber optic assembly:

The combination of the fully assembled transmitter array subassembly and its attached connector shell.

7c. receiver parallel fiber optic assembly:

The combination of the fully assembled receiver array subassembly and its attached connector shell.

8a. optical coupler housing:

A term used to refer to either the transmitter optical coupler housing or to the receiver optical coupler housing.

8b. transmitter optical coupler housing:

The molded plastic component designed to hold the optical coupler array and designed to be used in the transmitter premolded package.

8c. receiver optical coupler housing:

The molded plastic component designed to hold the optical coupler array and designed to be used in the receiver premolded package.

9a. optical coupler array:

A molded optical component designed to redirect light from the laser array chip to the uniformly spaced fibers of the parallel fiber optic connector, or from the uniformly spaced fibers of the parallel fiber optic connector to the uniformly spaced receiving photodetector elements of the receiver chip.

9b. housed optical coupler:

A term used to refer to the subassembly comprising an optical coupler housing into which has been permanently inserted an optical coupler array.

10. transmitter array subassembly:

All the components (electrical, optical and mechanical) required for receiving a plurality of electronic signals and for producing optical signals suitable for injection into the array of optical fibers on the entrance face of a parallel fiber optic connector (the term array subassembly may be used generically to refer to either a transmitter array subassembly or a receiver array subassembly).

11. receiver array subassembly:

all the components (electrical, optical and mechanical) required for receiving a plurality of optical signals as they leave the individual faces of the optical fibers of a parallel fiber optic connector, and producing a plurality of electronic signals therefrom.

12. connector shell:

A plastic molded component that attaches to the optical subassembly module and to the circuit board that serves as a mechanical strain relief device for the parallel fiber optic connector and a coarse alignment device that guides the parallel fiber optic connector into the bore of the optical coupler housing which is substantially contained within the optical subassembly module.

13a. parallel optical link:

The combination of hardware needed to provide a data link, comprising a plurality of optical channels, between a transmitter and a receiver.

13b. duplex parallel optical link:

Two parallel optical links connecting two separate electronic units where one of the two parallel optical links has digital information traveling in the opposite direction from the other.

14. optical transmitter chip:

A generic term for a semiconductor chip having one or more light emitting elements.

15. channel pitch:

A term used to describe the center-to-center spacing of one channel to an adjacent channel in a parallel optical link.

16. fiber ribbon cable:

Multiple optical fibers incorporated into an appropriate sheathing structure and having a ribbon-like shape.

17. optical ribbon jumper cable:

A fiber ribbon cable with parallel fiber optic connectors on both ends of the cable.

18. optically active chips:

A chip which has optically active components and which can be either a receiver array chip or a laser array chip.

19. semiconductor chips:

The collection of electronic chips mounted in a premolded package, comprising the optically active chips and the driver chip.

20. insulating tape:

The tape that separates the leadframe from the heat slug.

7

21. optical subassembly module:

The assembly comprising the premolded package and its complement of semiconductor chips.

22. parallel fiber optic connector, or "connector" not otherwise qualified:

The molded plastic component attached to either end of the fiber ribbon cable and designed to be inserted into the bore of either the receiver optical coupler housing or the bore of the transmitter optical coupler housing.

23. vent holes:

Holes provided in the optical coupler housing to allow for the passage of air during epoxy curing.

24. primary alignment pins:

One or more pin-like structures in the cavity of the premolded package designed to accept hole features in the optical coupler housing.

25. secondary alignment pins:

One or more pin-like structures on the heat slug side of the premolded package designed to accept hole features of the connector shell.

26. sealing epoxy:

An epoxy applied to the top of the leadframe prior to molding for the purpose of sealing the leadframe to one half of the mold.

Acronyms:

VCSEL: vertical cavity surface emitting laser

LVDS: low voltage differential signal

EMI: electromagnetic interference

MSM: metal semiconductor metal

OSA: optical subassembly

Mbs: mega bits per second

MBs: mega bytes per second

MESFET: metal semiconductor field effect transistor

OE: Optoelectronic

POI: parallel optical interconnect

Dictionary entries in alphabetical order:

| | |
|---|---|
| channel pitch | 15 |
| connector shell | 12 |
| driver array chip | 3 |
| duplex parallel optical link | 13b |
| fiber ribbon cable | 16 |
| heat slug | 1 |
| housed optical coupler | 9b |
| insulating tape | 20 |
| laser array chip | 5 |
| leadframe | 6a |
| optical coupler array | 9a |
| optical coupler housing | 8a |
| optical ribbon jumper cable | 17 |
| optical subassembly module | 21 |
| optical transmitter chip | 14 |
| optically active chips | 18 |
| parallel fiber optic assembly | 7a |
| parallel fiber optic connector | 22 |
| parallel optical link | 13a |
| premolded package | 2a |
| primary alignment pins | 24 |
| receiver array chip | 4 |
| receiver array subassembly | 11 |
| receiver leadframe | 6c |
| receiver optical coupler housing | 8c |
| receiver parallel fiber optic assembly | 7c |
| receiver premolded package | 2c |
| sealing epoxy | 26 |
| secondary alignment pins | 25 |
| semiconductor chips | 19 |
| transmitter array subassembly | 10 |

8

-continued

| | |
|---|---|
| transmitter leadframe | 6b |
| transmitter optical coupler housing | 8b |
| transmitter premolded package | 2b |
| transmitter parallel fiber optic assembly | 7b |
| vent holes | 23 |

In order to transfer digital information from one electronic unit to another electronic unit over a parallel fiber optical link, a transmitter parallel fiber optic assembly, an optical ribbon jumper cable and a receiver parallel fiber optic assembly are required. Thus, two such units (collectively known as a duplex parallel optical link) are needed when signals must be simultaneously sent in both directions between two electronic units, a first electronic unit having a first transmitting device and a first receiving device, the second electronic unit having a second transmitting device and a second receiving device, with a first end of a first optical ribbon jumper cable connected to communicate with the first transmitting device and a second end of the first optical ribbon jumper cable connected to communicate with the second receiving device, and a first end of a second optical ribbon jumper cable connected to communicate with the second transmitting device and a second end of the second optical ribbon jumper cable connected to the first receiving device.

One aspect of the present invention is directed to providing the necessary alignment of features to ensure accurate data communication and at low cost.

FIG. 1 is a perspective view of an embodiment of the present invention. The apparatus shown includes a fiber ribbon cable 100, a parallel fiber optic connector 102 coupled to the cable 100, a parallel array subassembly (either transmitter or receiver) 104 to which the cable delivers optical signals or from which the cable receives signals, and a connector shell 106 for ensuring proper alignment and retention of parallel fiber optic connector 102 with respect to parallel array subassembly 104. The parallel array subassembly includes a heat slug 23, and either a transmitter array or receiver array semiconductor chip. These elements will now be discussed in detail.

The semiconductor chips

Figure 2:
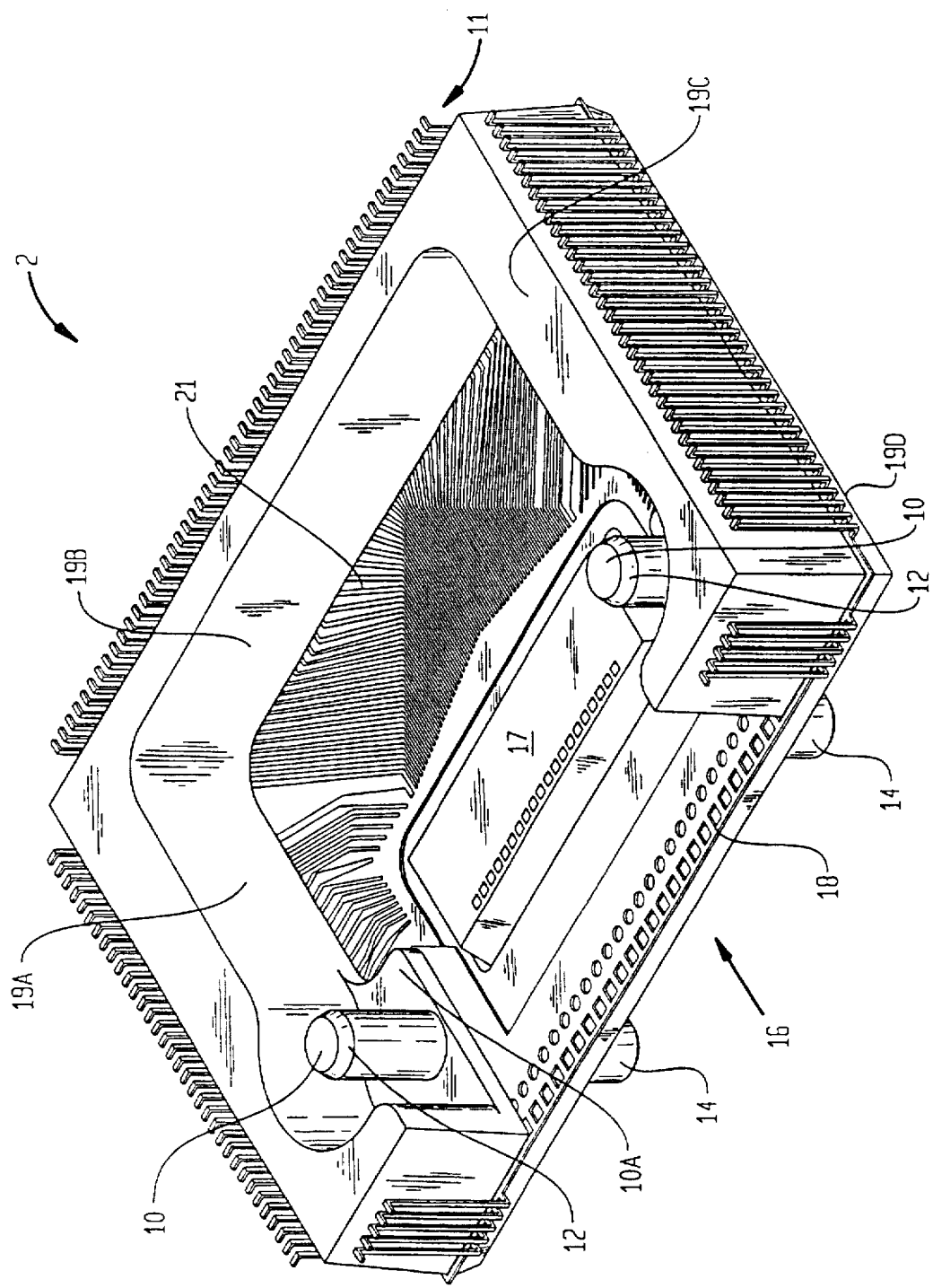
FIG. 2 is a perspective depiction of a receiver premolded package, the starting point from which a receiver array assembly is constructed, and shown after a receiver array chip has been mounted therein.
Figure 5:
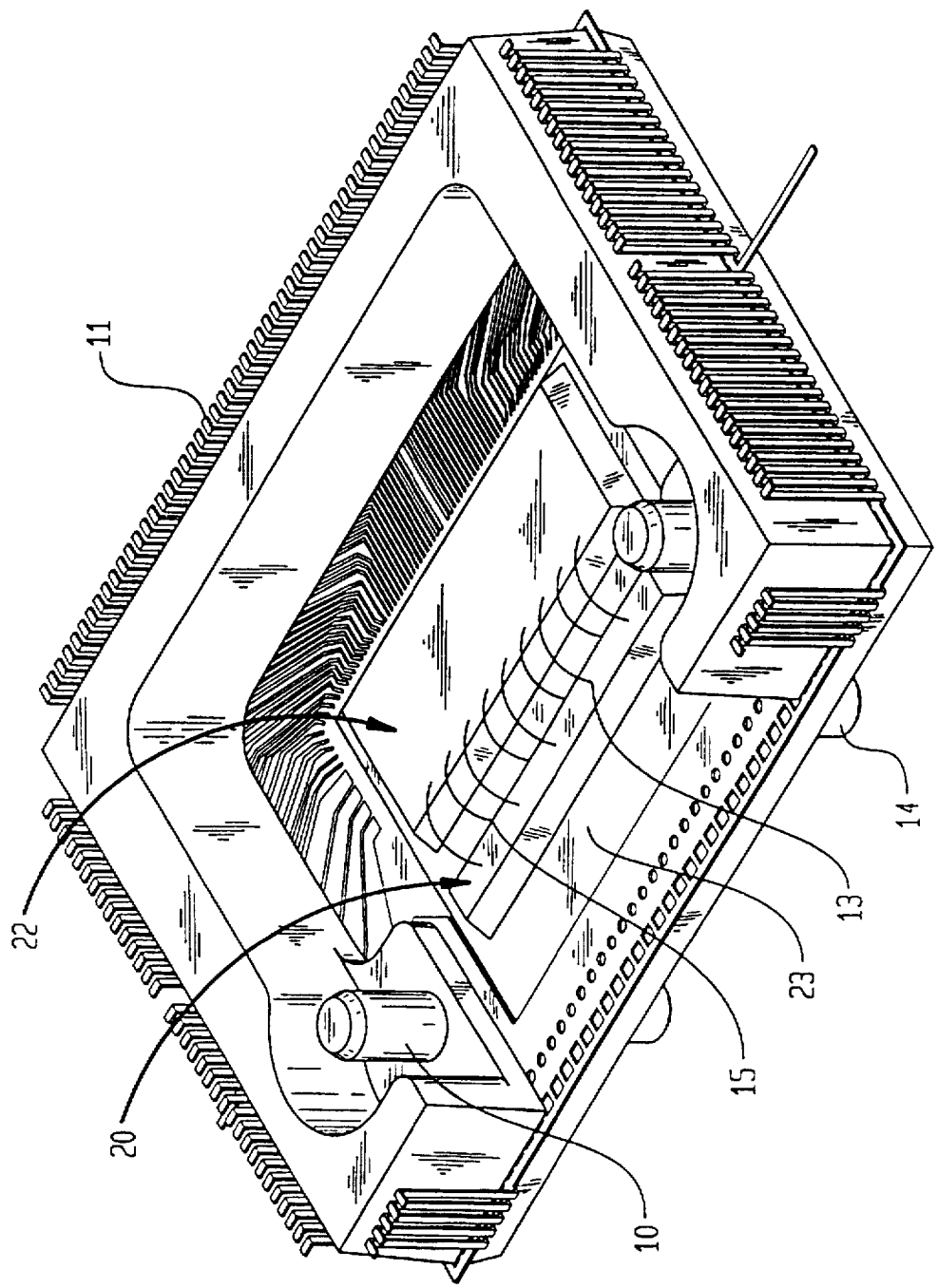
FIG. 5 is a perspective depiction of the transmitter premolded package after the driver chip and the laser array chip have been installed.

The set of chips comprises a single monolithic array receiver chip 17 in FIG. 2 made with MESFET GaAs technology, and a pair of chips for the transmitter: a driver array chip 22 and a GaAs VCSEL laser array chip 20 (each shown in FIG. 5).

In a preferred implementation, each VCSEL has an emission diameter in the 10–20 μm range to assure a collimated (low divergence angle) output beam as well as low laser coherence (to assure reliable data transmission when used in conjunction with the large core, multimode fiber). The VCSEL pitch is chosen for compatibility with low cost optical coupler design, nominally 250–500 μm.

The CMOS transmitter driver chip 22 accepts LVDS data signals applied via leadframe 11 and applies appropriate current pulses to the VCSELs via wire bonded conductors 13.

The receiver chip 17 (FIG. 2) contains an array of MSM detectors, each measuring approximately 300×400 micrometers. Each detector feeds a serially connected preamplifier, a postamplifier which brings the signal up to LVDS logic levels, and a decoder. The detector design is chosen to maximize the light detection area consistent with sufficient device bandwidth for the required data rate. For 500 MBs, this is the nominally 300–400 μm characteristic dimension.

The premolded packages:

The resulting package is shown in FIG. 2, which represents the receiver module. The layout and fabrication procedures for the transmitter module package are very similar to those of the receiver module except for modifications to permit acceptance of the VCSEL laser array chip and driver array chip instead of the receiver chip.

Figure 3:
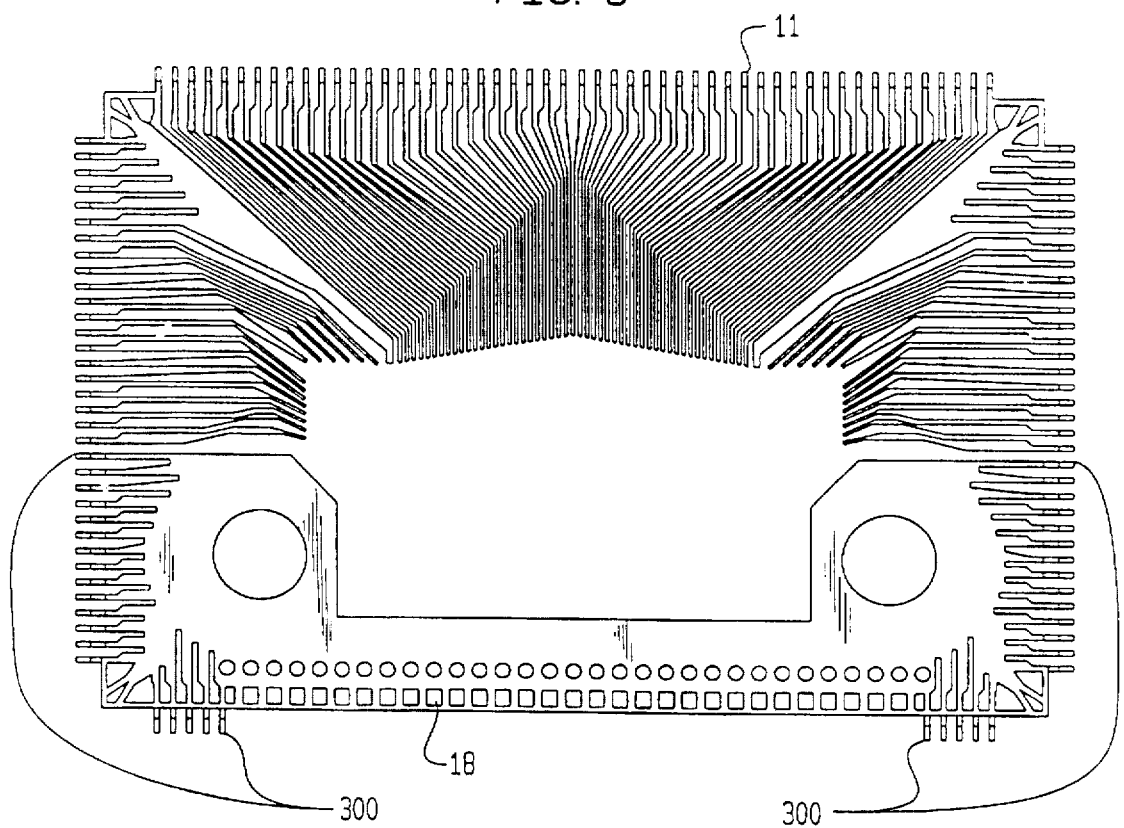
FIG. 3 is a plan view of a receiver leadframe.

In FIG. 2, a bottom view is shown of a partially completed receiver array subassembly as it appears after attaching the receiver to the exposed heat slug of the premolded package (FIG. 1 shows a top view). In use, this package is of the surface mount, cavity-down type. The leadframe 11 is shown as already formed in FIG. 2 for illustrative purposes only; in actuality the forming procedure occurs at the final stage of the manufacturing process. A view of the leadframe 11 alone (in particular, that portion of the leadframe encapsulated within the glass-filled resin) as it appears before molding is shown in FIG. 3. It is noted (FIG. 2) that the molded epoxy forms a cavity within the three walls 19a, 19b, and 19c extending vertically from the edges of base 19d. Thus, the floor of the cavity is substantially in the plane of the leadframe. The floor of the cavity accepts the receiver chip 17 with the exposed leadframe 11 in its vicinity so as to permit wirebonding from the ends of the leadframe fingers 21 to the chip. A fourth vertical wall defining the cavity is omitted, and instead an opening 16 is formed to permit insertion of the parallel fiber optic connector of the optical ribbon jumper cable (see below). A metal (e.g., Al or Cu) heat slug 23, preferably made by a stamping process, (shown in more detail in FIG. 4) is molded into the premolded package and forms the cavity floor.

Figure 4:
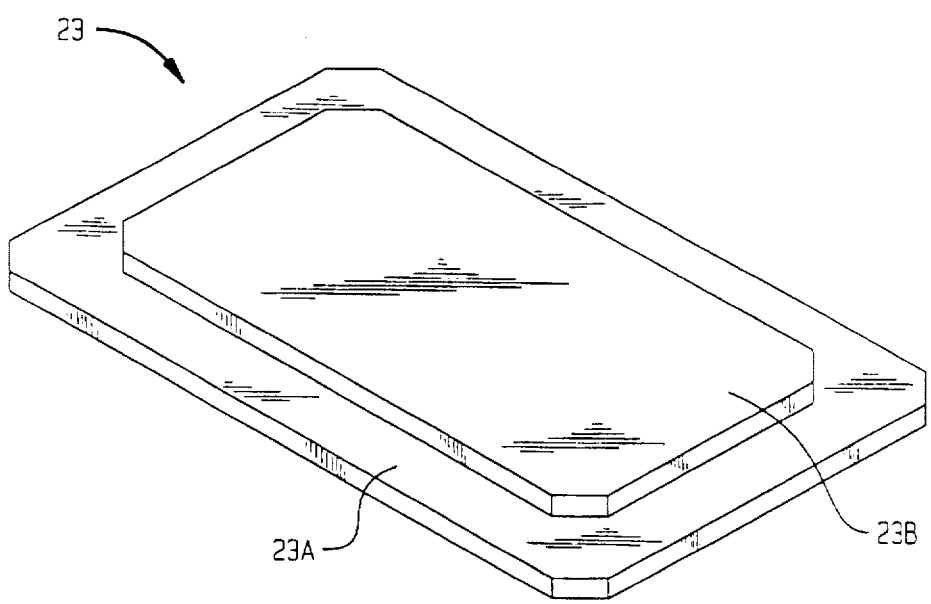
FIG. 4 is a perspective depiction of a heat slug used in the parallel fiber optic assembly of FIG. 1.

The receiver array chip 17 can be die bonded to the exposed top surface of the heat slug 23 (the top surface is opposite surface 23b, which is shown in FIG. 4 (and also shown, but not labelled in FIG. 1)) with silver epoxy. Shorting of the leadframe 11 to the heat slug 23 is prevented by the inclusion of an electrically insulated double-sided adhesive tape which bonds the leadframe to the heat slug. The insulating tape is patterned so as to expose the heat slug in the region occupied by the chip.

Figure 9A:
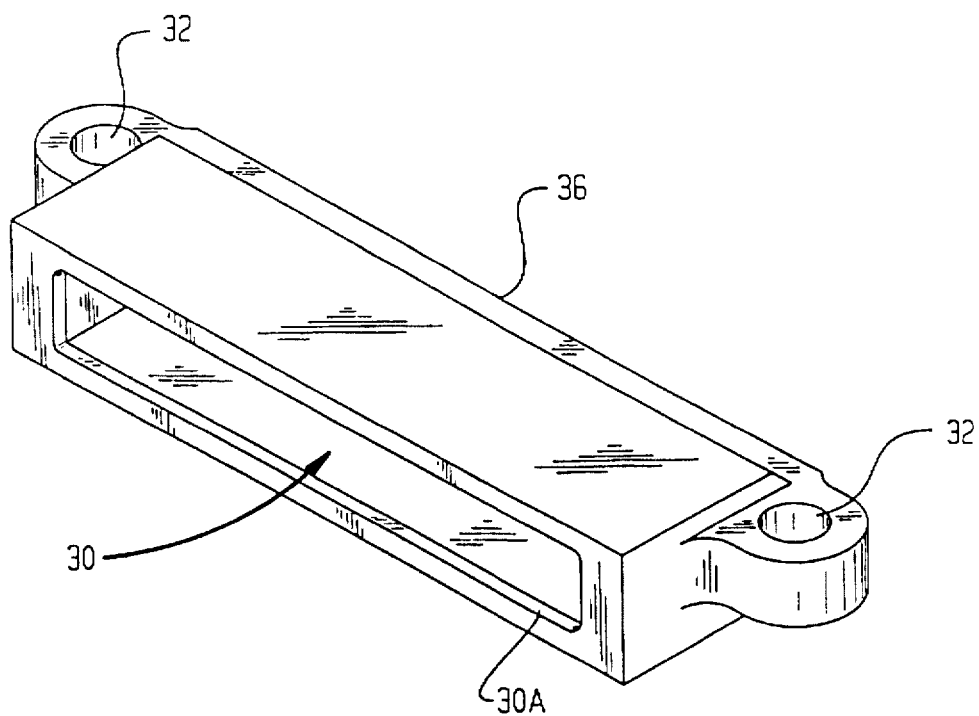
FIG. 9a is a perspective depiction of the top and front of a receiver optical coupler housing.

In accordance with the present invention, special features have been designed into the package to permit successful functioning as now described. First, referring to FIG. 2, alignment means, such as vertical primary alignment pins 10, optionally having beveled ends 12 protrude from small pedestals 10a at either side of the cavity floor. These pins 10, which can be molded into the premolded package in the same molding step and of the same material, provide mechanical reference for positioning of both the receiver array chip 17 and the optical coupler housing 36 (FIG. 9A). Fabrication of the primary alignment pins 10 as part of the premolded package provides a low cost but precise method of forming the pins. Integrally molded pins 10 have the advantage of reducing the number of process steps. As an alternative to molding pins 10 from the same material and integral to the package 2, these pins can be made of a suitable metal, and either inserted after molding into holes formed in the package, or formed in the package by placing the pins in the appropriate location in the package mold. In this latter embodiment, the metal pins can be positioned to perform the function of the primary alignment pins 10 (at one end) and the function of the secondary alignment pins 14 (at the other end).

Referring to FIG. 9A, the bore entrance 30 has an additional feature. This is a beveled edge 30A and that edge provides a means for guiding the connector 102 into the optical coupler housing 36 in such a way that the connector entrance 30 does not have to be perfectly aligned with the bore. There is a tolerance between the connector and the corresponding faces of the bore of the order plus or minus 75 to 100 μm.

The second special feature includes two secondary vertical pins 14 provided on the opposite side of the package (FIG. 2). These secondary alignment pins 14 are used to locate the connector shell 106 (FIG. 1.) with respect to the premolded package (see below). Again, it should be noted that a single pin can be used.

The connector shell 106 which attaches to the secondary alignment pins then must be located with respect to the bore entrance 30 within this relatively large 75–100 μm tolerance. This means that the secondary alignment pins must be located relative to the primary alignment pins within a tolerance; of about 50 micrometers. The body is located relative to the chip and the connector shell in such a way that when the connector is inserted into the shell it slides in a self-aligning manner into the bore. Thus, the connector is in its proper position with respect to the optical coupler after it has seated in the bore.

Figure 12:
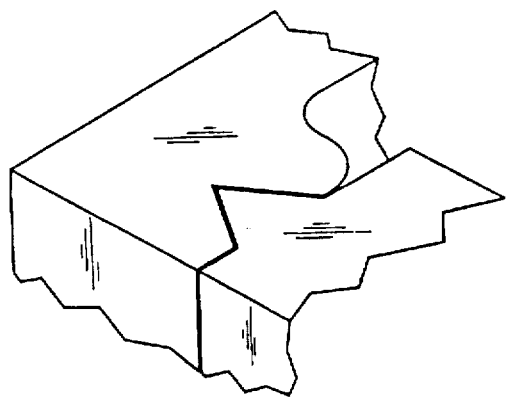
FIG. 12 depicts a tongue-and-groove implementation of the primary alignment pins of the present invention.
Figure 13:
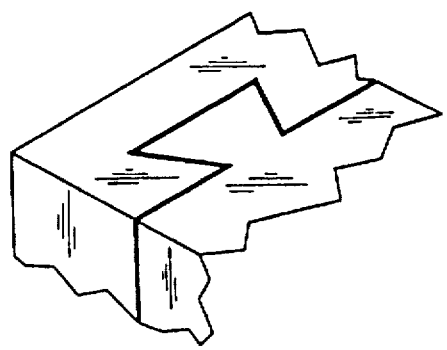
FIG. 13 depicts a dovetail implementation of the primary alignment pins of the present invention.
Figure 14:
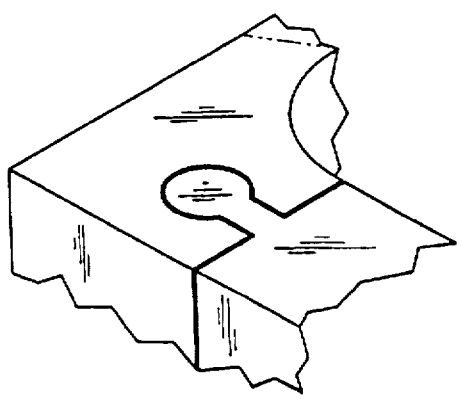
FIG. 14 depicts another implementation of the primary alignment pins of the present invention.

Shapes other than cylindrical pins could, of course, be used for providing the desired mechanical reference; a tongue and grove design, as shown in FIG. 12, a dove-tail design as shown in FIG. 13, or other interlocking relationship as shown in FIG. 14 provides such an alternative. Details of the use of these pins in alignment of the receiver/transmitter chip and the optical coupler will be found below. It should also be noted that a single alignment pin can be used although with less beneficial results.

As discussed above, the symmetry of the more common postmolded "quad" package is broken here by an opening 16 on a fourth side of the package. This accommodates the insertion of the parallel fiber optic connector 102.

The transmitter premolded module package differs from the receiver premolded package just described in only a few respects. Accordingly, in order to maintain low cost, an identical mold can be used for both packages, so that the two packages have the same external geometry. However, instead of a receiver chip, the transmitter premolded package must accommodate the laser array chip 20 and driver chip 22, as illustrated in FIG. 5. The positions of the chips within the transmitter premolded are selected so that the light-emitting regions of the VCSEL in the transmitter premolded package have the same relative positions with respect to the primary alignment pins 10 as do the light-receiving regions of the receiver chip of the receiver premolded. This geometry enables use of the same optical coupler array 25 (FIG. 8) for both premolded packages, but because of the different footprints of the chips for the two parallel fiber optic assemblies, the leadframe designs of the transmitter and receivers are different. There are also two different housings: the transmitter optical coupler housing and the receiver optical coupler housing.

Figure 6:
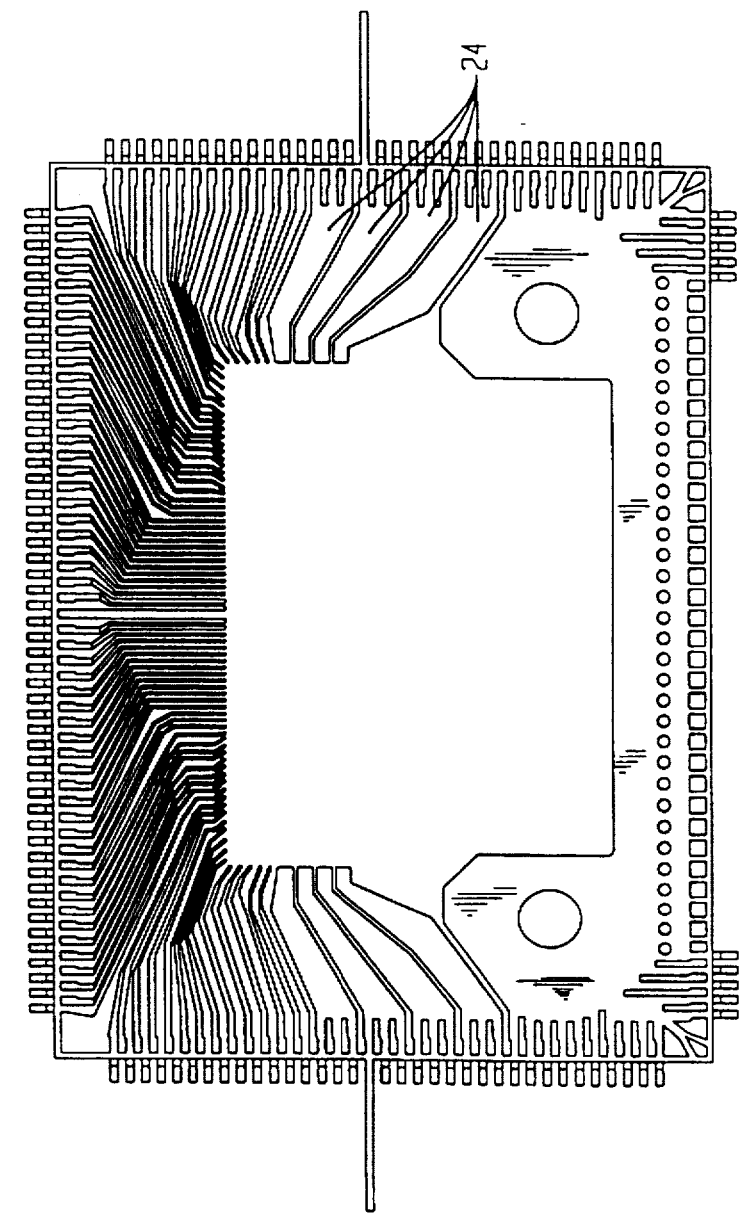
FIG. 6 is a plan view of a transmitter leadframe.

The transmitter leadframe is shown in FIG. 6. This leadframe differs from that of the receiver leadframe (FIG. 3) in details of the lead layout; one such feature is the presence of eight very wide leads 24 to provide low-inductance paths between the external leads of the leadframe and the driver array chips for the high supply currents required by the driver chip. Each channel of the laser array chip 20 is fed from a corresponding channel of the driver array chip by means of direct wire bonded conductors 13 from the driver array chip to the laser array chip. The return paths 15 from the laser array chip 20 are all routed through the heat slug 23, so that the return path for each channel is completed by making a wirebond from the driver chip ground directly to the heat slug in the immediate vicinity of the corresponding emitter.

Figure 7:
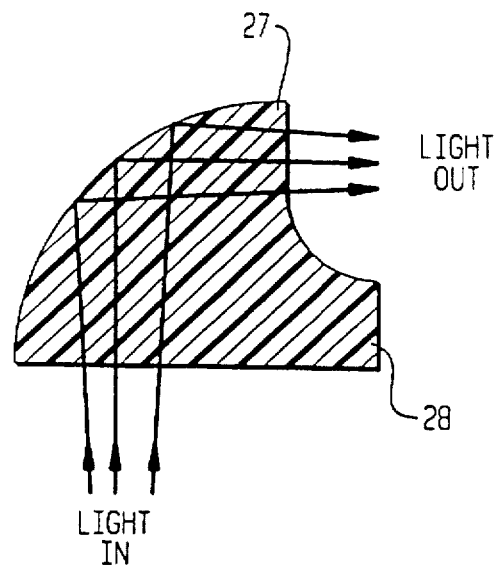
FIG. 7 is a cross-sectional view illustrating the passage of light rays through the center of one element ("fin") of an optical coupler array.

The optical coupler:

The function of the optical coupler 25 is to provide a 90 degree bend in the light path of each channel between the optically active chip and the fiber. It accomplishes this task by means of a series of fin-shaped elements 27 (FIGS. 7, 8) which serve to reflect and focus the light. The focusing action is provided by the curved back of the fin, whose elliptically shaped surface provides the focusing. Those light rays which have a component of the propagation vector out of the plane of the fin of FIG. 7 are accommodated by multiple reflections from the side walls of each fin.

Figure 8:
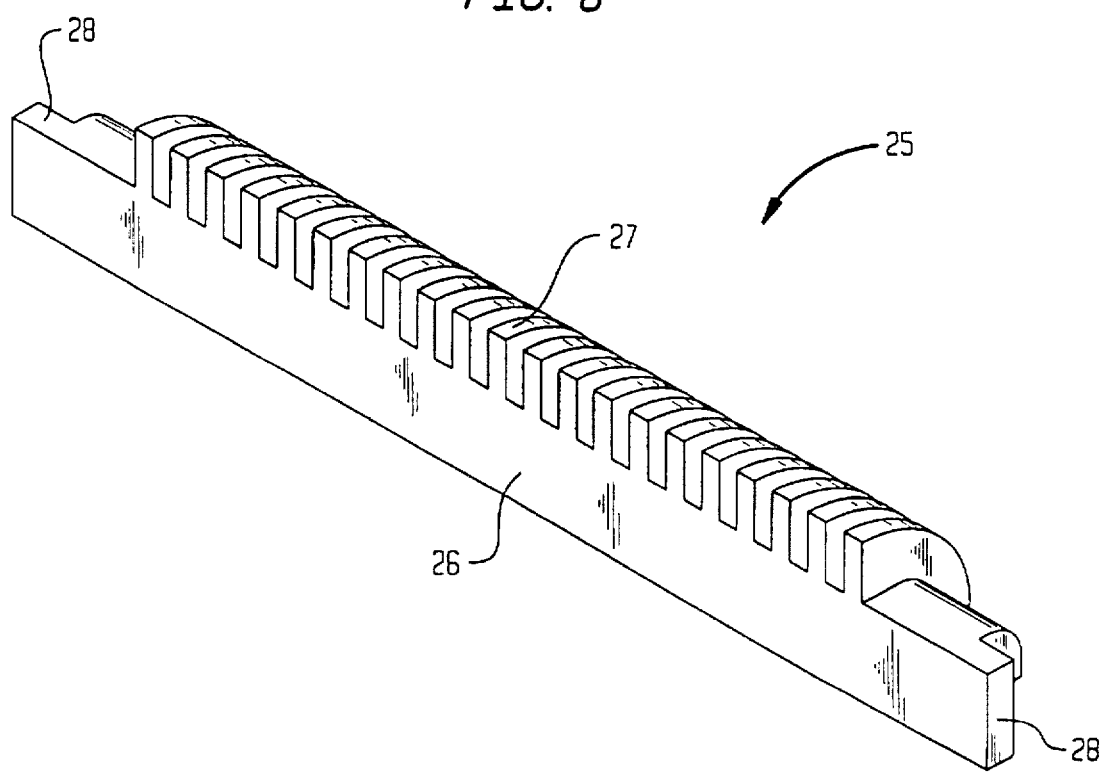
FIG. 8 is a perspective depiction of the optical coupler array and shows the coupler foot, the coupler backbone and a plurality of the optical coupler fins.

The fins 27 are linked together by a "backbone" 26 which serves as a stiffening member. This optical element can be injection molded from a high-temperature clear plastic (e.g., polyethersulfone), and subsequently metallized to provide the required reflectivity. A projection along the backbone provides a foot 28 which rests on the heat slug 23 and thereby defines the critical vertical spacing between the optically active chip and the optical coupler array (FIGS. 7, 8).

Figure 9B:
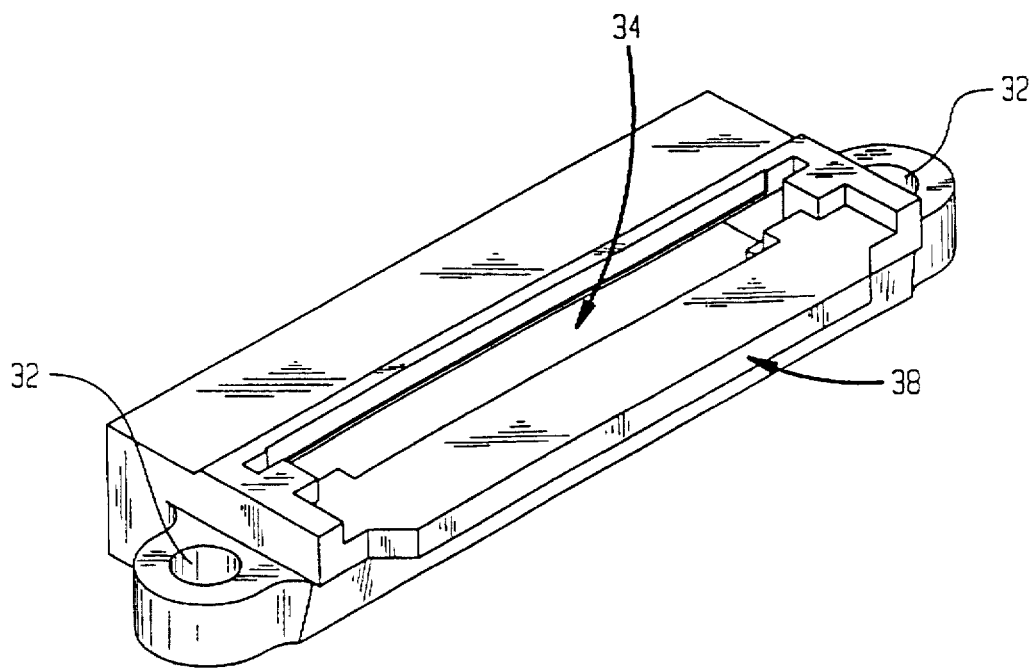
FIG. 9b is a perspective depiction of the bottom and rear of a receiver optical coupler housing.

Referring to FIG. 9a and FIG. 9b, the optical coupler array 25 is inserted into a receptacle 34 in an opaque housing 36 which provides a bore entrance 30 for insertion of the parallel fiber optic connector 102 (FIG. 1) and pin receptacles 32 for insertion over the primary alignment pins 10 in the premolded package (FIG. 2). Although the optical coupler array 25 and optical coupler housing 36 are designed so as to provide an interference fit therebetween, they are also bonded together by an epoxy operation. The epoxy not only provides additional mechanical stiffness to the ensemble, but also permits achievement of a bubble-tight seal; in the absence of the epoxy, solid or liquid contaminants or active agents carried by air (e.g., oxygen, acids, etc.) could leak into the package through the crevices between the optical coupler array 25 and the housing 36. A low-viscosity, transparent epoxy is used for this purpose.

As mentioned above, although the optical coupler is identical for both the receiver and transmitter assemblies, thereby saving cost, because of the different chip positions associated with the two modules, the coupler housings must be slightly different. Their differences lie primarily in the lengths of the "nose" 38 of the optical coupler housing 36, i.e., that portion of the optical coupler housing 36 closest to the chip (FIG. 9b). The nose must be close enough to the chip to permit a good seal during the potting operation (see below), yet not interfere with the wire bonds. An optical coupler housing with a longer nose is required for the two chips of the transmitter than that corresponding to the receiver array subassemblies module.

The optical ribbon jumper cable and connector shell:

For the present application, optical ribbon jumper cables are made by applying two mating halves of an injection molded plastic structure over an array of optical fibers, which is subsequently encapsulated between two adhesive type layers, thus forming a fiber optic ribbon cable with embedded connecting structures. Each structure is designed such that a subsequent median cut across its width results in two connectorized cable ends with smoothly cut fibers, flush with the plastic. This automated technique provides low-cost optical ribbon jumper cables.

Each fiber of the optical ribbon jumper cable 100 must ultimately align accurately to a corresponding fin 27 of the optical coupler array 25. To accomplish this goal several criteria must be met:

(a) The outer diameter of the buffer (i.e., a plastic layer surrounding the plastic-cladded glass portion of the fiber) must be maintained accurately concentric with the fiber center.

(b) The plastic body of the parallel fiber optic connector 102 must be designed so that the fibers are adequately captured while accurately maintaining the correct fiber-to-fiber spacing.

(c) The rectangular shape of the end of each parallel fiber optic connector 102, which forms the ferrule of the connector, must be accurately made so that the ferrule fits snugly into the bore entrance 30 (FIG. 9a) of the optical coupler array housing.

(d) The optical coupler 25 must be accurately positioned within cavity 34 of the optical coupler housing 36.

Figure 10:
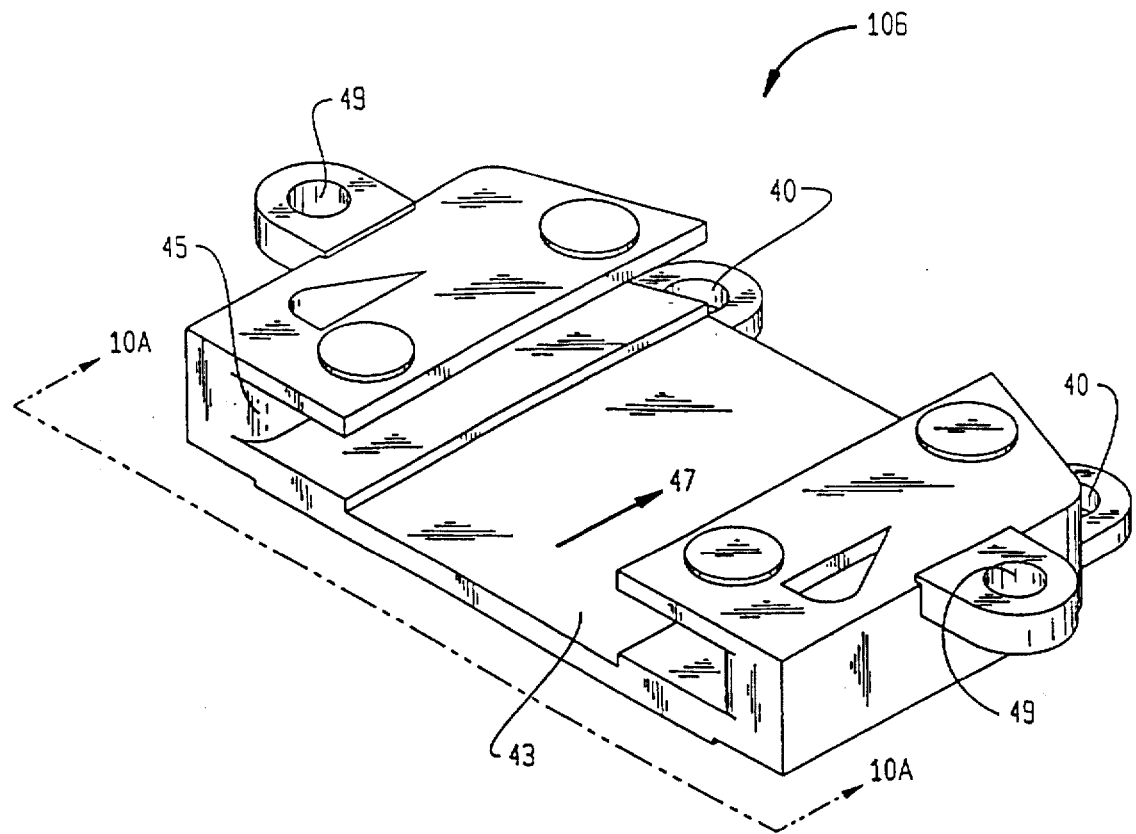
FIG. 10 is a perspective depiction of a connector shell.
Figure 10A:
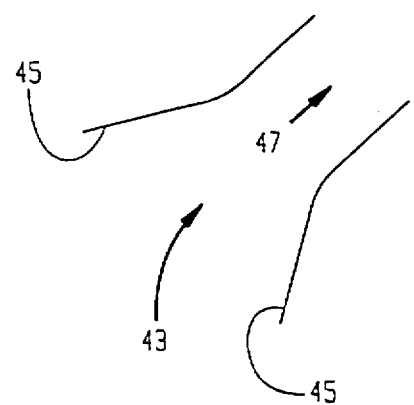
FIG. 10a is a cross-sectional view of the connector shell of FIG. 10, taken along lines A—A.

Also in accordance with the invention, means are provided for easy alignment of the parallel fiber optic connector 102 with the bore entrance 30 during connector insertion, while at the same time preventing application of large forces to the delicate parts of the array subassembly. The required operation is achieved by inclusion of a connector shell 106 shown in FIG. 10, which provides coarse alignment of the connector 102 to the parallel fiber optic assembly during plug-in, and guides the ferrule of the connector into the bore 30 of the optical coupler housing. Specifically, as shown by dotted lines 41 in FIG. 10, a flared slot 43 through the tapering connector shell is formed by the tapering walls 45 as they progress in the direction of arrow 47. A cross-sectional view in FIG. 10A of FIG. 10 shows the tapering of walls. Further, a key can be placed on the connector to prevent upside-down insertion into the connector shell.

Also, holes 40 are provided in the shell for mating with secondary alignment pins 14 which are molded into the package on the side opposite the primary alignment pins 10 (FIG. 2). While some accuracy may be lost because of the secondary-to-primary pin-positioning tolerance, this inaccuracy is of relatively minor consequence because the connector shell performs only a guiding function, with the final positioning being dictated by the ferrule-bore mating. The connector shell is firmly attached to the card by means of holes 49 complementary to pins on the card (not shown) provided in projections on its sides.

Figure 11:
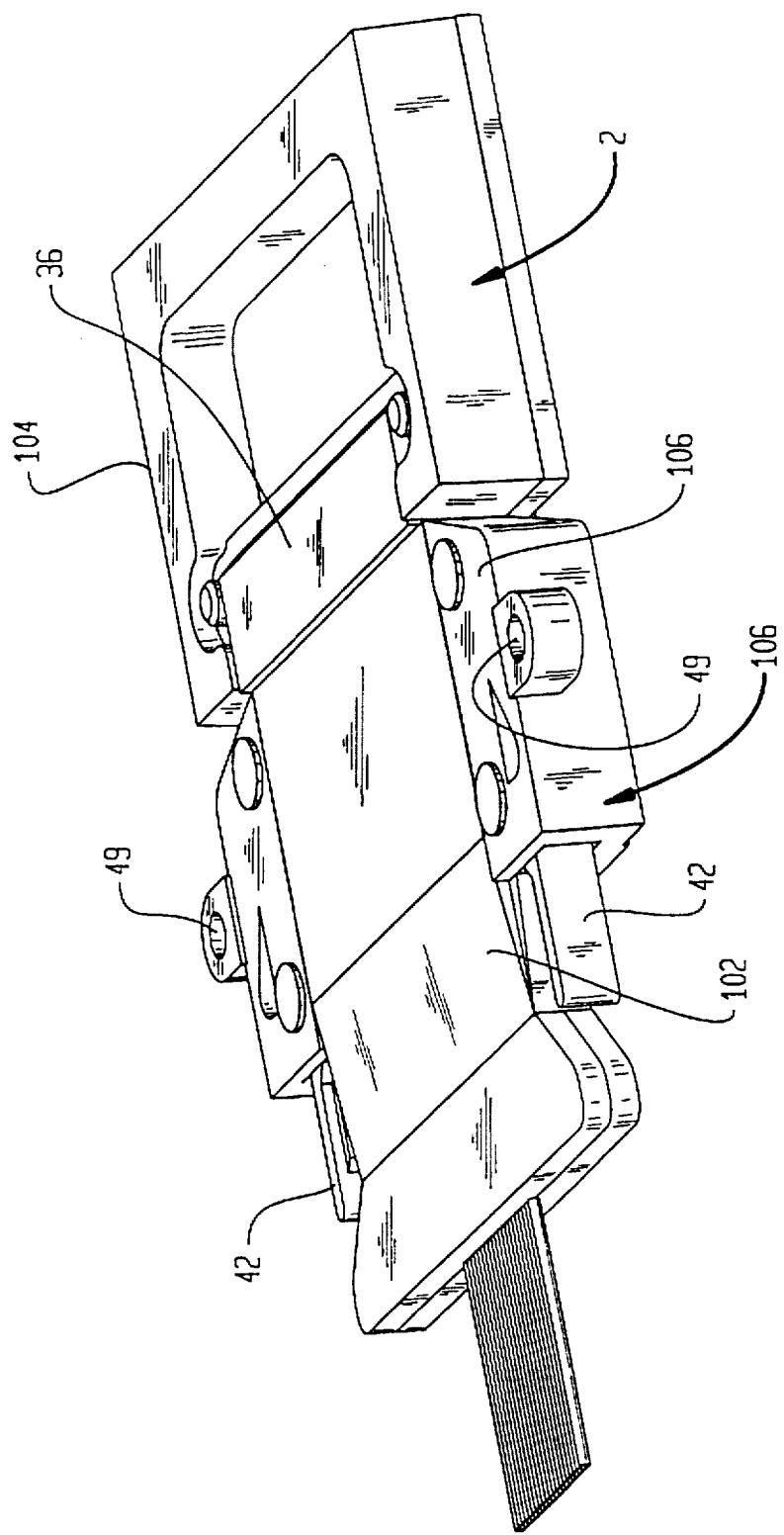
FIG. 11 is a perspective depiction of an incompletely assembled receiver array subassembly, with the optical ribbon jumper cable installed within the connector shell, and the optical coupler housing.

Referring to FIG. 11, another view of the apparatus of FIG. 1 will now be discussed. FIG. 11 shows the connecter shell 106, through which is inserted connector 102 such that it is aligned with optical coupler housing 36 in premolded package 104. The connector includes springed "wings" 42 that are molded on either side of the connector, so that projections on these wings snap into corresponding cavities molded into the connector shell 106 after insertion. This detente provides protection against inadvertent pullout of the connector, and the entire arrangement decreases the chance of application of large forces directly to the premolded package 104 and particularly the optical coupler array. The fact that only a small portion of the wings protrude from the connector shell 106 after insertion also diminishes the chance of damaging the package by application of excessive force from the fingers during insertion.

While the invention has been described particularly with respect to preferred embodiments thereof, it will be apparent that modifications to the disclosed embodiments can be effected without departing from the spirit and scope of the invention.

We claim:

1. A parallel fiber optic connector assembly comprising:
a support means for supporting an optoelectric array:
a connector shell having means for receiving a parallel fiberoptic connector and for constraining alone a linear axis a motion of the received parallel fiberoptic connector;

an optoelectric array mounted to the said support means;

a positioning attachment means for attaching the connector shell to said support means at a position so that the connector shell and the parallel connector received by the connector shell are in a predetermined relationship with respect to the optoelectric array.

2. An apparatus according to claim 1, wherein the positioning attachment means includes an alignment pin connected to the support means and a complementary pin receptacle formed in the connector shell.

3. An apparatus according to claim 1, wherein the locating attachment means includes an alignment pin connected to the connector shell and a complementary pin receptacle formed in the support means.

4. An apparatus according to claim 1, further comprising:

an optical coupler means for optically coupling the parallel fiberoptic connector received by said connector shell to said optoelectric array, said means arranged within an optical coupler housing, said optical coupler housing having a means for receiving an end of the parallel connector received by said connector shell and having a locating member for cooperatively engaging said locating attachment means;

and wherein the locating attachment means connects to said locating structure and further comprises an alignment means integral to the support means for cooperatively engaging with the locating means of the optical coupler housing.

5. An apparatus according to claim 1, further comprising an optical coupler housing, a parallel optical coupler arranged within said housing, and an alignment means for positioning the optical coupler in a predetermined relation with locating attachment means.

6. An apparatus according to claim 5, wherein the alignment means comprises a pin attached to the optical coupler housing.

7. An apparatus according to claim 5, wherein the alignment means comprises a groove formed in the support means, and a complementary tongue formed on the optical coupler housing.

8. An apparatus according to claim 6, wherein the pin is unitary with and is formed of the same material as the support means.

9. An apparatus according to claim 1, wherein the connector shell comprises a base plate having a bottom support surface and a pair of sidewalls substantially perpendicular thereto extending in a direction of said axis to form a channel between the pair of sidewalls for said constraining of the motion of the received fiberoptic connector, the channel having a first end for insertion of the fiberoptic connector and a second end for exit of an end of the inserted fiberoptic connector, the sidewalls being arranged such that the channel has a larger width at the first end than at the second end.

10. An apparatus according to claim 1, wherein the support means comprises a base plate, the base plate including a heat slug.

11. An apparatus according to claim 10, wherein the locating attachment means includes a pin unitary with the heat slug.

12. An apparatus according to claim 10, wherein the locating attachment means comprises alignment pin receptacles formed in the heat slug.

13. An apparatus according to claim 1, wherein the support means comprises:

a support enclosure formed by a rectangular base and three sidewalls extending upward from three edges thereof and defining an opening along the fourth edge thereof;

a pair of alignment pins located within the support enclosure;

an optical coupler housing having means for supporting a parallel optical coupler, the optical coupler housing having means for receiving the pair of alignment pins;

wherein the alignment pins and the means for receiving the pair of alignment pins are arranged such that when the means for receiving the pair of alignment pins received the alignment pins the optical coupler housing is positioned in a predetermined location.

14. An apparatus according to claim 4, wherein the alignment means comprises one or more pins attached to the optical coupler housing, and one or more complementary pin receptacles formed in the support means.

15. An apparatus according to claim 1 further comprising:

a fiberoptic connector, for receipt by said connector shell, having an engagement member; and means for releasably securing said received fiberoptic connector to the connector shell, said means including means for engaging said engagement member.

* * * * *